(12) United States Patent
Dening et al.

(10) Patent No.: US 6,329,809 B1
(45) Date of Patent: Dec. 11, 2001

(54) RF POWER AMPLIFIER OUTPUT POWER SENSOR

(75) Inventors: David C. Dening, Stokesdale; Paul J. Augustine, Kernersville, both of NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/492,488

(22) Filed: Jan. 27, 2000

Related U.S. Application Data

(63) Continuation-in-part of application No. 09/384,679, filed on Aug. 27, 1999.

(51) Int. Cl.⁷ ............................................. G01R 15/10
(52) U.S. Cl. ............................................................ 324/95
(58) Field of Search ........................... 324/95, 158.1, 324/119; 343/703; 330/279, 130, 138, 280; 455/126, 115

(56) References Cited

U.S. PATENT DOCUMENTS

| | | | |
|---|---|---|---|
| 4,578,648 | 3/1986 | Werrbach | 330/281 |
| 4,794,343 | 12/1988 | Yang | 330/2 |
| 5,081,425 | 1/1992 | Jackson et al. | 330/207 P |
| 5,087,893 | 2/1992 | Petersen et al. | 330/296 |
| 5,138,274 | 8/1992 | Nakanishi et al. | 330/136 |
| 5,144,258 | 9/1992 | Nakanishi et al. | 330/129 |
| 5,177,453 | 1/1993 | Russell et al. | 330/284 |
| 5,216,379 | 6/1993 | Hamley | 330/134 |
| 5,241,694 * | 8/1993 | Vais/Anen et al. | 455/126 |
| 5,381,115 | 1/1995 | Timmons et al. | 330/279 |
| 5,384,547 | 1/1995 | Lynk, Jr. et al. | 330/136 |
| 5,430,410 | 7/1995 | Raynaud et al. | 330/279 |
| 5,455,968 | 10/1995 | Pham | 455/127 |
| 5,497,125 | 3/1996 | Royds | 330/290 |
| 5,559,471 | 9/1996 | Black | 330/277 |
| 5,629,648 | 5/1997 | Pratt | 330/289 |
| 5,675,245 * | 10/1997 | Millar et al. | 324/95 |
| 5,745,016 | 4/1998 | Salminen | 333/17.1 |
| 5,892,396 | 4/1999 | Anderson et al. | 330/129 |
| 5,892,397 | 4/1999 | Belcher et al. | 330/149 |

* cited by examiner

Primary Examiner—Vinh P. Nguyen
(74) Attorney, Agent, or Firm—Withrow & Terranova, P.L.L.C.

(57) ABSTRACT

A system for sensing RF amplifier output power includes an amplifier transistor and two sampling transistors. The two sampling transistors are physically smaller than the amplifier transistor, and are preferably the same size. The first sampling transistor is configured to sample the same RF input signal that is amplified by the amplifier transistor. The second sampling transistor is configured to receive and amplify only a bias network signal. The bias network associated with the transistors includes a selection of components based upon operating parameters as well as actual physical sizes of the transistors. The selection of component values in association with transistor sizes is used to enable generation of a current sensing signal that is proportional to the power level of the RF output signal generated by the amplifier transistor. The RF sensing signal is corrected for bias current effects and bias shifts by subtracting the sampled bias current amplified by the second sampling transistor from the RF current sensing signal.

17 Claims, 3 Drawing Sheets

RF POWER AMPLIFIER OUTPUT POWER SENSOR

This is a continuation-in-part of Application Ser. No. 09/384,679, filed Aug. 27, 1999.

BACKGROUND OF THE INVENTION

(1) Field of the Invention

The present invention generally relates to radio frequency (RF) power amplifier output power detection techniques and, more particularly, to a system and method for sensing power consumed by a RF power amplifier.

(2) Description of the Prior Art

Portable wireless transmitter systems generally require that a specified radio frequency (RF) output power be delivered to the radiating antenna. Further, many such systems are required to back-off or reduce the transmitted power to achieve a specific level depending upon signal strength. To meet the aforesaid requirements, the system architecture generally incorporates a closed-loop power control scheme. Typically, this scheme requires a "sampling" of the RF power amplifier output power that is subsequently fed back to predetermined control circuitry which generates a control signal that adjusts the output power until it is within the specified power level. Such sampling of the output power is disadvantageous in that it increases the insertion loss between the output of the power amplifier and the radiating antenna. Therefore, sampling of the output power decreases the available output power from the power amplifier and reduces the overall talk time. Talk time is a measure of the time a portable transceiver can be in the "talk" mode before the battery is fully depleted. The power amplifier consumes the majority of the current and therefore dominates in the calculation of talk time.

A common technique for sampling the output power includes use of a directional coupler on the output of the power amplifier. The power coupled from the main signal path is diode detected to generate a video signal proportional to the amplitude of the RE, voltage delivered to the antenna. Use of directional couplers, however, adds loss to the system, forcing the power amplifier to consume more power thereby reducing the talk time of the associated radio unit. In typical applications, the aforesaid loss is often 5–10% of the power amplifier output power and relates to a direct loss in available talk time.

Another common technique for detecting the output power includes measurement of the current consumed by the power amplifier. This current is directly related to the output power generated by the power amplifier and is also fed back to predetermined power control leveling circuitry. This technique is also disadvantageous due to the loss associated with the current measurement. This current measurement generally requires that a series "dropping" element be added between the associated battery and the power amplifier bias input. The voltage across this element will determine the current entering the power amplifier (for a known resistance across the element). In typical applications, the voltage across the dropping element will be about 3% of the total battery voltage. Because this is a loss in the dc input power to the power amplifier, the loss of talk time will be even higher than 3% due to the less than 100% dc-rf conversion efficiency of the power amplifier. For example, if the power amplifier efficiency is 60%, then the talk time loss will be 3/0.6 or 5%.

Thus, there remains a need for a new and improved technique for current sensing associated with RF amplifier power detection.

SUMMARY OF THE INVENTION

The present invention is directed to a system and method relating to current sensing to detect RF amplifier output power. A small current sensing transistor is added in parallel with a large transistor that delivers the high power to the antenna. The current in this sensing transistor is proportional to the current in the large transistor. The current in the large transistor is directly related to the output power generated by the power amplifier. By using a small current sensing transistor, talk time loss is reduced by less than 1%. This small transistor is dc biased and RF driven proportionally to the large output transistor. The small transistor (sampling transistor) is about $1/250^{th}$ the size of the larger output transistor which results in a scaling factor such that the additional current required for sensing is about 0.4% of the total current consumed by the power amplifier.

In order to compensate for a dominating quiescent bias current at low power levels, the present invention incorporates a second small current sensing transistor that is in parallel with the large transistor and the first small current sensing transistor. However, the second small current sensing transistor does not receive the RF signal driving the large transistor and the first small current sensing transistor. Rather, the second small current sensing transistor only receives a bias current. Preferably, the second small transistor is the same physical size as the first small transistor. This configuration allows the power sensed by the first small current sensing transistor to be corrected for bias current effects and bias current shifts.

Accordingly, one feature of the present invention includes a technique for measurement of RF amplifier output power that reduces talk time by less than 1%.

Another feature of the present invention includes a technique for measurement of RF amplifier output power that is more efficient than known measurement techniques.

Still another feature of the present invention includes a technique for measurement of RF amplifier output power which consumes about an order of magnitude less power than that consumed by using known techniques.

Yet another feature of the present invention includes a technique for measurement of RF amplifier output power that compensates for bias current effects and bias current shifts.

These and other features of the present invention will become apparent to those skilled in the art after a reading of the following description of the preferred embodiment when considered with the drawings.

DESCRIPTION OF THE PREFERRED EMBODIMENTS

Figure 1:
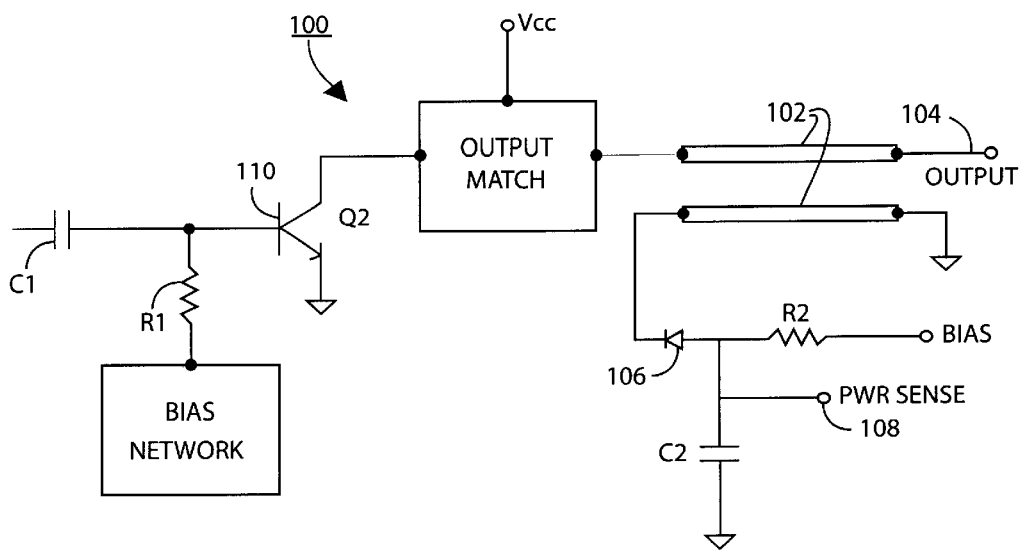
FIG. 1 is a simplified schematic diagram illustrating a traditional method of RF power sensing known in the art.

In the following description, like reference characters designate like or corresponding parts throughout the several views. Referring now to the drawings in general and FIG. 1 in particular, it will be understood that the illustrations are for the purpose of describing a preferred embodiment of the invention and are not intended to limit the invention thereto. In FIG. 1, a simplified schematic diagram illustrates a traditional RF power sensing system known in the art, generally designated 100. As stated herein, many RF systems need to know how much power is being supplied. The classical solution is to obtain samples of the RF energy being supplied via a coupling scheme, rectify the samples and use the resulting voltage as an indication of the power being supplied. A pair of coupled transmission lines 102 are used as the directional coupler. The power coupled from the main signal path 104 is detected via a diode 106, i.e. Schottky diode to generate a video signal, e.g. PWR_Sense 108, proportional to the amplitude of the RF output voltage delivered to the antenna (not shown). As stated above, such directional couplers 102 add loss to the system 100, forcing the power amplifier 110 to deliver more power, thus reducing the valuable talk time of the associated radio (not shown).

Figure 2:
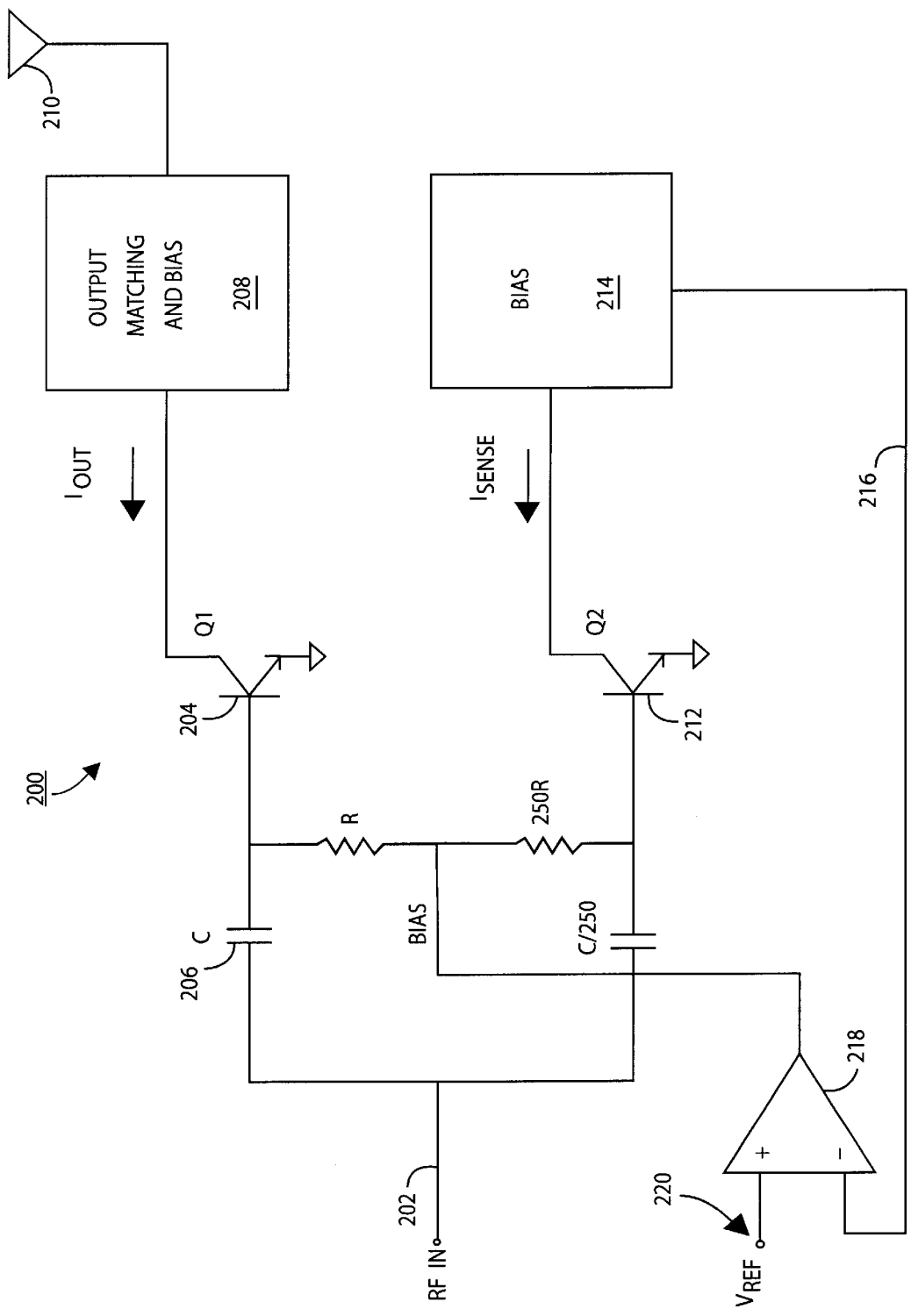
FIG. 2 is a simplified schematic diagram illustrating a current sensing system constructed according to one embodiment of the present invention.

FIG. 2 illustrates a simplified schematic diagram showing a current sensing system 200 constructed according to one embodiment of the present invention. A radio frequency signal is received by the system 200 at the rf-in signal port 202 where it is coupled to a RF amplifier transistor 204 via coupling capacitor 206. An output matching and bias network 208 provides the necessary dc power and antenna matching to provide efficient transmission of the amplified RF signal to the associated antenna 210. The output matching and bias network 208 details are not important to the present invention and are not discussed herein to preserve brevity and enhance clarity associated with the present discussion of the invention. It is sufficient to state that a typical output matching network generally consists of a combination of inductors and capacitors configured to provide an impedance match between the RF amplifier transistor 204 output impedance and the antenna 210 input impedance. FIG. 2 also illustrates an implementation of RF output power sensing that is accomplished in part via a small RF signal sensing (sampling) transistor 212. The small RF sampling transistor 212 is deployed in parallel with the RF amplifier transistor 204 that is physically much larger than the small sampling transistor 212. Coupling a small amount of the drive energy from the output stage into a small parallel device provides an integrated approach for indicating the power supplied by an amplifier. The small sampling transistor 212 is dc biased via a dedicated bias network 214. Details of the dc bias network 214 are not central to the present invention and so will not be discussed herein except to state that such bias schemes are well known to those skilled in the art and may consist of nothing more than a voltage source coupled to the small sampling transistor 212 via a resistor (not shown). In one embodiment, the size of the small sampling transistor 212 is about $1/250^{th}$ the size of the RF amplifier transistor 204. The present invention is not so limited however, and it shall be understood that other ratios associated with sizing of the RF amplifier transistor 204 and the small sampling transistor 212 will also be effective to practice the present invention. For example, the aforesaid ratio could just as well be any number between 1 and 500 or larger. Larger ratios could also be used in association with dedicated applications and processing technologies. With a scaling factor of 250, the additional current required for sensing is only about 0.4% of the total current consumed by the current sensing system 200 RF amplifier transistor 204. This is an order of magnitude less than the loss incurred by power measurement and sensing systems known in the art. For example, directional couplers reduce a typical transmitter's total efficiency by about 5% or more.

Figure 3:
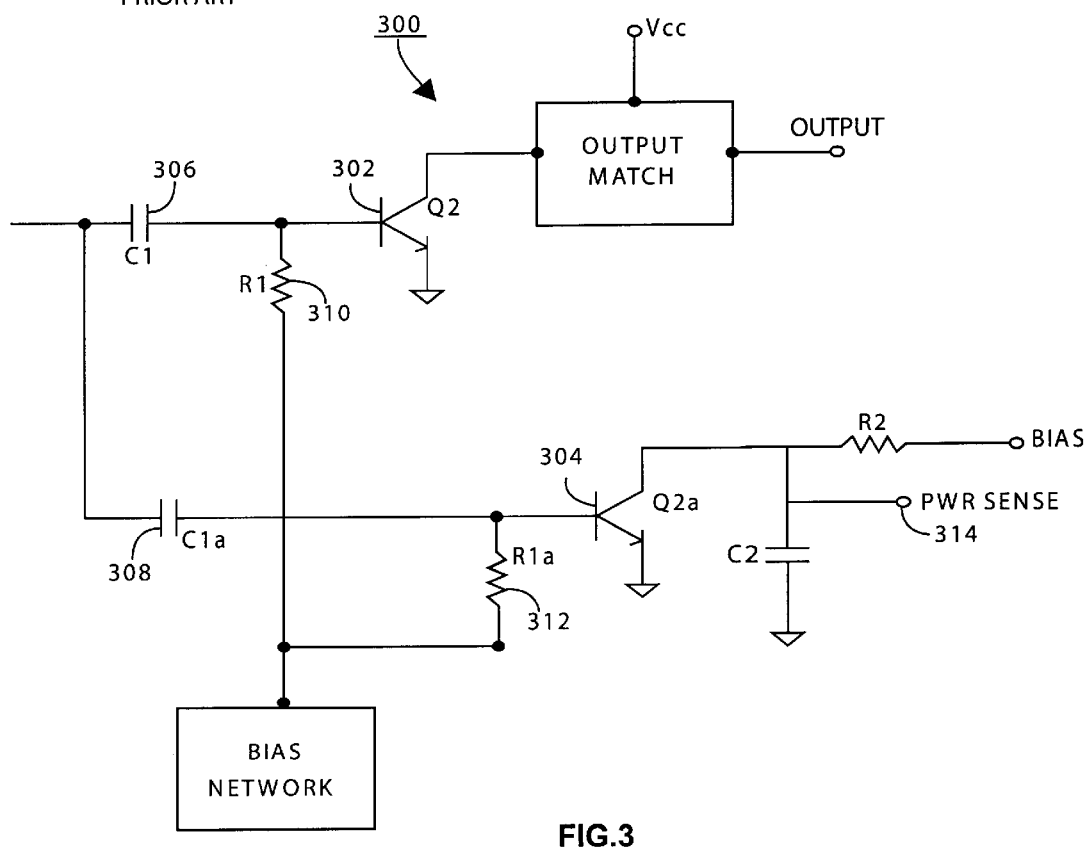
FIG. 3 is a more detailed schematic diagram illustrating a current sensing system according to another embodiment of the present invention.

FIG. 3 illustrates a more detailed schematic diagram of a current sensing system 300 according to another embodiment of the present invention. With reference to the foregoing discussion above regarding ratio sizes, a typical ratio of device sizes for RF amplifier transistor 302 and sampling transistor 304 can be 224 to 1. In this case, the RF signal coupling capacitors 306, 308 will employ a similar ratio while the bias resistors 310, 312 will optimally employ a ratio of 1 to 224. The values for coupling the capacitor 306 and bias resistor 310 will be set by the design value associated with the specific application parameters. In operation, the RF drive signal through capacitor 306 and capacitor 308 turns on the RF amplifier transistor 302 and the sampling transistor 304 proportional to the RF signal amplitude. The current flowing through the sampling transistor 304 then flows through bias resistor R2 and reduces the voltage across capacitor C2. The output power can then be determined by sensing the bias current flowing through bias resistor R2 at the PWR_Sense junction 314 using techniques familiar to those skilled in the art of voltage/current transformations. As illustrated in FIG. 2, it can be seen that the varying voltage across capacitor C2 (now hidden inside bias network 214) can also be used in a feedback loop to change the gain of the RF amplifier transistor 204. A differential amplifier 218 compares a reference voltage 220 with the changing voltage across capacitor C2 and changes the DC quiescent bias current to affect a change in the RF amplifier transistor 204 gain characteristics. The output power can thus be increased or decreased as desired. Most preferably, the RF signal coupling capacitors 306, 308, bias resistors 310, 312 and transistors 302, 304 are integrated on the same die, leaving the connections to transistor collectors open to maximize flexibility in configuring the power sense option desired.

While the embodiments illustrated in FIGS. 2 and 3 provide an improved technique for current sensing associated with RF amplifier power detection, there is one disadvantage of the approach. The Q2a collector current (304 FIG. 3) is composed of the DC quiescent current and the induced RF current. Therefore, at low power levels, the quiescent bias current is the dominating current. If the PWR_Sense voltage across C2 is used to control the RF power level, any change in the bias current introduces an error. Such a change in the bias current could result from a change in the temperature or power supply.

Figure 4:
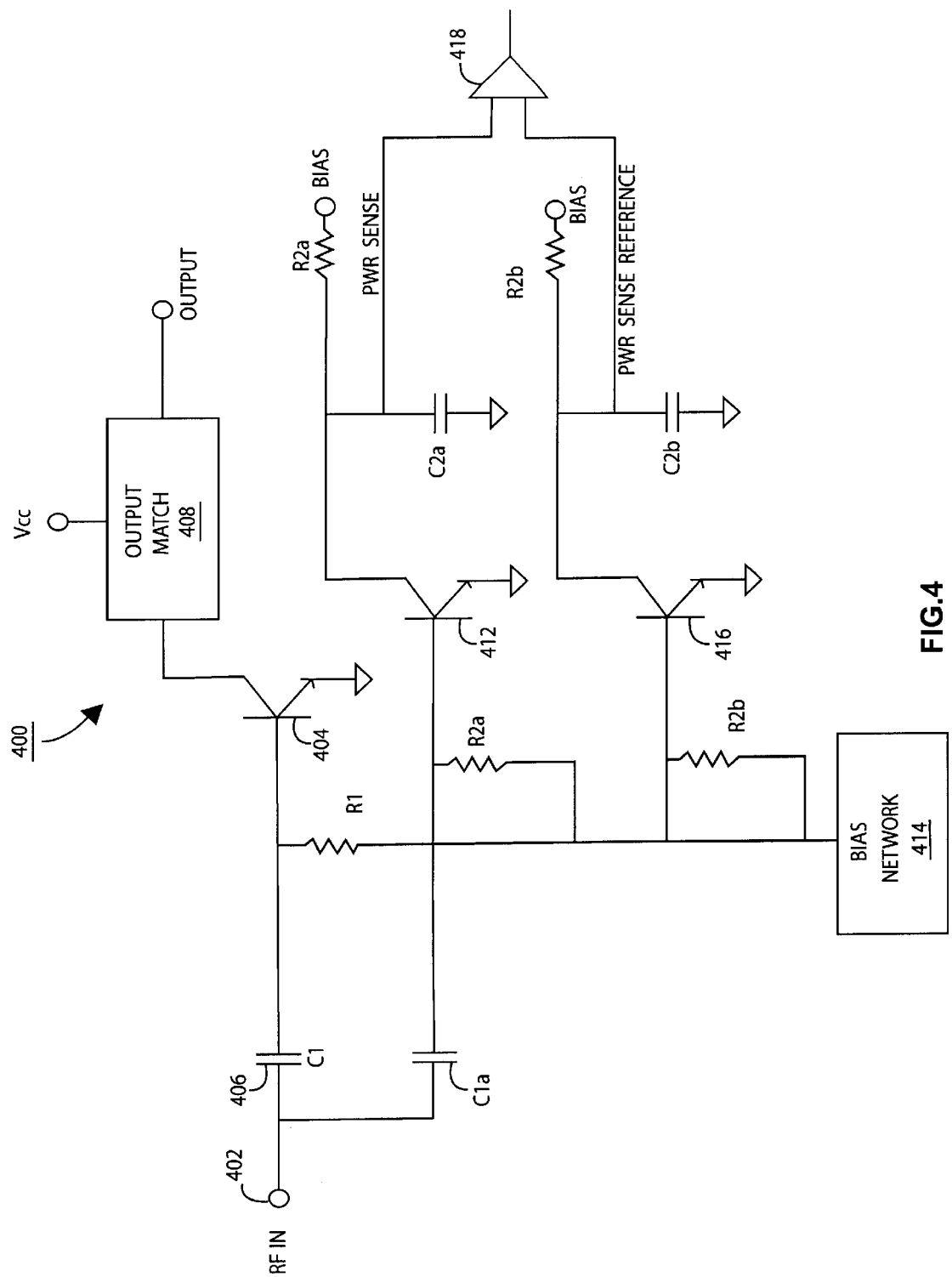
FIG. 4 is a simplified schematic diagram illustrating a current sensing system that compensates for bias changes according to another embodiment of the present invention.

FIG. 4 illustrates a simplified schematic diagram showing a current sensing system 400 that compensates for erroneous contributions of a bias current according to another embodiment of the present invention. A RF signal is received by the system 400 at the RF-in signal port 402 where it is coupled to a RF amplifier transistor 404 via coupling capacitor 406. An output matching and bias network 408 provides the necessary dc power and antenna matching to provide efficient transmission of the amplified RF signal to the associated antenna (not shown). A small RF sampling transistor 412 is deployed in parallel with the RF amplifier transistor 404, which is physically much larger than the small sampling transistor 412. The small sampling transistor 412 is dc biased via a dedicated bias network 414. As noted above, the size of the small sampling transistor 412 may be about $1/250^{th}$ the size of the RF amplifier transistor 404. The present invention is not so limited, however, and it shall be understood that other ratios associated with sizing of the RF amplifier transistor 404 and the small sampling transistor 412 will also be effective to practice the present invention.

In order to compensate for a dominating quiescent bias current at low power levels, the system 400 includes a second small sampling transistor 416. This second small sampling transistor 416 is also physically much smaller than the RF amplifier transistor 404 and is optimally the same physical size as the first small sampling transistor 412. The second small sampling transistor 416 is deployed in parallel with the first small sampling transistor 412, however, it does not receive any of the RF drive. Rather, the second small sampling transistor 416 receives and amplifies only the bias current from the bias networking 414. As a result of this configuration, the predicted power can be corrected for bias current effects and bias current shifts. More specifically, a simple differential amplifier 418 connected between the PWR_Sense and PWR_Sense _Reference can be used to cancel erroneous contributions of the bias current to the predicted power.

Certain modifications and improvements will occur to those skilled in the art upon a reading of the foregoing description. By way of example, the embodiments described herein above are based upon specific circuit architectures. The present invention is not so limited, however. It shall be understood that those skilled in the art can use a wide variety of circuit architectures including electronic and electromechanical components, either integrated or discrete or combinations thereof to practice the present invention so long as the transistor ratio functionality described herein is retained. Also, it shall be understood that the present invention is not limited to use of a particular processing technology, e.g. HBT, Silicon BJT, CMOS, and the like. It should be understood that all such modifications and improvements have been deleted herein for the sake of conciseness and readability but are properly within the scope of the following claims.

We claim:

1. Amplifier circuitry comprising:
   a) a radio frequency power amplifier for amplifying a radio frequency input signal and having:
      i) a radio frequency amplifier input for receiving the radio frequency input signal,
      ii) a bias input for receiving a bias signal for biasing the radio frequency power amplifier, and
      iii) a power amplifier output providing an amplified radio frequency signal;
   b) a first transistor circuit having:
      i) a first input for receiving the radio frequency input signal,
      ii) a first bias input for receiving the bias signal, and
      iii) a first output providing a first output signal having a bias component and a radio frequency component proportionally smaller than the amplified radio frequency signal; and
   c) a second transistor circuit having:
      i) a second bias input for receiving the bias signal, and
      ii) a second output for providing second output signal corresponding to the bias component.

2. The amplifier circuitry of claim 1 further comprising bias circuitry adapted to provide the bias signal as a function of the first and second outputs.

3. The amplifier circuitry of claim 2 wherein the bias circuitry provides the bias signal to compensate for output power of the amplified radio frequency signal.

4. The amplifier circuitry of claim 1 further comprising power sensing circuitry including a subtraction circuitry adapted to subtract the second output signal from the first output signal to provide a signal proportional to output power of the amplified radio frequency signal.

5. The amplifier circuitry of claim 1 wherein the first and second transistor circuits consist essentially of transistors providing substantially similar current gains.

6. The amplifier circuitry of claim 5 wherein the transistors of the first and second circuits are substantially the same size.

7. The amplifier circuitry of claim 5 wherein the current gain of the first and second transistor circuits are substantially smaller then a current gain for the power amplifier circuitry.

8. The amplifier circuitry of claim 5 wherein the power amplifier circuitry is implemented using transistor circuitry.

9. The amplifier circuitry of claim 8 wherein the first and second transistor circuits are substantially the same size and proportionally smaller than the power amplifier circuitry.

10. Amplifier circuitry comprising:
    a) a radio frequency power amplifier for amplifying a radio frequency input signal and having:
       i) a radio frequency amplifier input for receiving the radio frequency input signal,
       ii) a bias input for receiving a bias signal for biasing the radio frequency power amplifier, and
       iii) a power amplifier output providing an amplified radio frequency signal;
    b) a first transistor circuit having:
       i) a first input for receiving the radio frequency input signal,
       ii) a first bias input for receiving the bias signal, and
       iii) a first output providing a first output signal having a bias component and a radio frequency component proportionally smaller than the amplified radio frequency signal; and
    c) bias circuitry adapted to provide the bias signal as a function of the first output, wherein the bias circuitry provides the bias signal to compensate for output power of the amplified radio frequency signal.

11. The amplifier circuitry of claim 10 further comprising a second transistor circuit having:
    a) a second bias input for receiving the bias signal, and
    b) a second output for providing second output signal corresponding to the bias signal, wherein the bias circuitry is adapted to provide the bias signal as a function of the second output such that the bias signal compensates for output power of the amplified radio frequency signal.

12. The amplifier circuitry of claim 10 further comprising power sensing circuitry including a subtraction circuitry adapted to subtract the second output signal from the first output signal to provide a signal proportional to output power of the amplified radio frequency signal.

13. The amplifier circuitry of claim 10 wherein the first and second transistor circuits consist essentially of transistor s providing substantially similar current gains.

14. The amplifier circuitry of claim 13 wherein the transistors of the first and second circuits are substantially the same size.

15. The amplifier circuitry of claim 13 wherein the current gain of the first and second transistor circuits are substantially smaller then a current gain for the power amplifier circuitry.

16. The amplifier circuitry of claim 13 wherein the power amplifier circuitry is implemented using transistor circuitry.

17. The amplifier circuitry of claim 16 wherein the first and second transistor circuits are substantially the same size and proportionally smaller than the power amplifier circuitry.

* * * * *